(12) United States Patent
Nishimoto et al.

(10) Patent No.: US 7,811,428 B2
(45) Date of Patent: *Oct. 12, 2010

(54) METHOD AND APPARATUS FOR AN IMPROVED OPTICAL WINDOW DEPOSITION SHIELD IN A PLASMA PROCESSING SYSTEM

(75) Inventors: Shinya Nishimoto, Nirasaki (JP); Kouji Mitsuhashi, Nirasaki (JP); Hidehito Saigusa, Nirasaki (JP); Taira Takase, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 922 days.

This patent is subject to a terminal disclaimer.

(21) Appl. No.: 11/620,289

(22) Filed: Jan. 5, 2007

(65) Prior Publication Data

US 2007/0102287 A1 May 10, 2007

Related U.S. Application Data

(60) Continuation of application No. 10/803,994, filed on Mar. 19, 2004, now Pat. No. 7,163,585, which is a division of application No. 10/259,352, filed on Sep. 30, 2002, now Pat. No. 6,798,519.

(51) Int. Cl.
*C23C 14/34* (2006.01)
*C23C 16/00* (2006.01)

(52) U.S. Cl. .............. 204/298.11; 156/345.24; 156/345.25; 118/715; 204/298.32

(58) Field of Classification Search ............ 204/298.11, 204/298.32; 156/345.24, 345.25; 118/715
See application file for complete search history.

(56) References Cited

U.S. PATENT DOCUMENTS

| | | | |
|---|---|---|---|
| 4,310,390 A | 1/1982 | Bradley et al. | |
| 4,357,387 A | 11/1982 | George et al. | .................. 442/71 |
| 4,469,619 A | 9/1984 | Ohno et al. | |
| 4,593,007 A | 6/1986 | Novinski | |
| 4,612,077 A | 9/1986 | Tracy et al. | |
| 4,649,858 A | 3/1987 | Sakai et al. | |
| 4,842,683 A | 6/1989 | Cheng et al. | |
| 4,877,757 A | 10/1989 | York et al. | |
| 5,000,113 A | 3/1991 | Wang et al. | |
| 5,074,456 A | 12/1991 | Degner et al. | |

(Continued)

FOREIGN PATENT DOCUMENTS

DE    94 21 671    7/1996

(Continued)

OTHER PUBLICATIONS

Machine Translation of 2000-077395 dated Mar. 2000.*

(Continued)

*Primary Examiner*—Rodney G McDonald
(74) *Attorney, Agent, or Firm*—Oblon, Spivak, McClelland, Maier & Neustadt, L.L.P.

(57) ABSTRACT

The present invention presents an improved optical window deposition shield for optical access to a process space in a plasma processing system through a deposition shield, wherein the design and fabrication of the optical window deposition shield advantageously provides an optically clean access to the processing plasma in the process space while sustaining substantially minimal erosion of the optical window deposition shield.

24 Claims, 10 Drawing Sheets

U.S. PATENT DOCUMENTS

| | | | |
|---|---|---|---|
| 5,126,102 A | 6/1992 | Takahashi et al. | |
| 5,180,467 A | 1/1993 | Cook et al. | |
| 5,302,465 A | 4/1994 | Miller et al. | |
| 5,334,462 A | 8/1994 | Vine et al. | |
| 5,362,335 A | 11/1994 | Rungta | |
| 5,366,585 A | 11/1994 | Robertson et al. | |
| 5,367,838 A | 11/1994 | Visaisouk et al. | |
| 5,423,936 A | 6/1995 | Tomita et al. | |
| 5,426,310 A | 6/1995 | Tamada et al. | |
| 5,484,752 A | 1/1996 | Waku et al. | |
| 5,489,449 A | 2/1996 | Umeya et al. | |
| 5,494,713 A | 2/1996 | Ootuki | |
| 5,521,790 A | 5/1996 | Ruckel et al. | 361/234 |
| 5,534,356 A | 7/1996 | Mahulikar et al. | |
| 5,551,190 A | 9/1996 | Yamagishi et al. | |
| 5,556,501 A | 9/1996 | Collins et al. | |
| 5,614,055 A | 3/1997 | Fairbairn et al. | |
| 5,637,237 A | 6/1997 | Oehrlein et al. | |
| 5,641,375 A | 6/1997 | Nitescu et al. | |
| 5,651,723 A | 7/1997 | Bjornard et al. | |
| 5,680,013 A | 10/1997 | Dornfest et al. | |
| 5,725,960 A | 3/1998 | Konishi et al. | |
| 5,759,360 A | 6/1998 | Ngan et al. | |
| 5,798,016 A | 8/1998 | Oehrlein et al. | |
| 5,820,723 A | 10/1998 | Benjamin et al. | |
| 5,834,070 A | 11/1998 | Movchan et al. | |
| 5,851,343 A | 12/1998 | Hsu et al. | |
| 5,868,848 A | 2/1999 | Tsukamoto | |
| 5,879,575 A | 3/1999 | Tepman et al. | |
| 5,882,411 A | 3/1999 | Zhao et al. | |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,891,350 A | 4/1999 | Shan et al. | |
| 5,892,278 A | 4/1999 | Horita | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,904,778 A | 5/1999 | Lu et al. | |
| 5,911,852 A | 6/1999 | Katayama et al. | |
| 5,919,332 A | 7/1999 | Koshiishi et al. | |
| 5,925,228 A | 7/1999 | Panitz | 204/484 |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,079,356 A | 6/2000 | Umotoy et al. | |
| 6,082,444 A | 7/2000 | Harada et al. | |
| 6,096,161 A | 8/2000 | Kim et al. | |
| 6,106,625 A | 8/2000 | Koai et al. | |
| 6,108,189 A | 8/2000 | Weldon et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A | 9/2000 | Han et al. | |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,178,919 B1 | 1/2001 | Li et al. | |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady | |
| 6,266,133 B1 | 7/2001 | Miyajima et al. | |
| 6,296,716 B1 | 10/2001 | Haerle et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,387,817 B1 | 5/2002 | Buckfeller | |
| 6,394,026 B1 | 5/2002 | Wicker et al. | |
| 6,413,578 B1 | 7/2002 | Stowell et al. | |
| 6,444,083 B1 | 9/2002 | Steger et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,429 B2 | 3/2003 | O'Donnell et al. | |
| 6,544,380 B2 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | |
| 6,613,442 B2 | 9/2003 | O'Donnell et al. | |
| 6,632,549 B1 | 10/2003 | Ohashi et al. | |
| 6,641,697 B2 | 11/2003 | Han et al. | |
| 6,663,714 B2 | 12/2003 | Mizuno et al. | |
| 6,695,929 B2 | 2/2004 | Kanekiyo et al. | |
| 6,724,140 B2 | 4/2004 | Araki | |
| 6,726,801 B2 | 4/2004 | Ahn | |
| 6,733,620 B1 | 5/2004 | Sugiyama et al. | |
| 6,738,862 B1 | 5/2004 | Ross et al. | |
| 6,771,483 B2 | 8/2004 | Harada et al. | |
| 6,776,873 B1 | 8/2004 | Sun et al. | |
| 6,783,863 B2 | 8/2004 | Harada et al. | |
| 6,783,875 B2 | 8/2004 | Yamada et al. | |
| 6,798,519 B2 | 9/2004 | Nishimoto et al. | |
| 6,805,952 B2 | 10/2004 | Chang et al. | |
| 6,806,949 B2 | 10/2004 | Ludviksson et al. | |
| 6,811,651 B2 | 11/2004 | Long | |
| 6,830,622 B2 | 12/2004 | O'Donnell et al. | |
| 6,833,279 B2 | 12/2004 | Choi | |
| 6,837,966 B2 | 1/2005 | Nishimoto et al. | |
| 6,852,433 B2 | 2/2005 | Maeda | |
| 6,863,594 B2 | 3/2005 | Preising | |
| 6,875,477 B2 | 4/2005 | Trickett et al. | |
| 6,884,516 B2 | 4/2005 | Harada et al. | |
| 6,894,769 B2 | 5/2005 | Ludviksson et al. | |
| 6,896,785 B2 | 5/2005 | Shatrov et al. | |
| 7,137,353 B2 | 11/2006 | Saigusa et al. | |
| 7,147,749 B2 | 12/2006 | Nishimoto et al. | |
| 7,163,585 B2 | 1/2007 | Nishimoto et al. | |
| 7,166,166 B2 | 1/2007 | Saigusa et al. | |
| 7,166,200 B2 | 1/2007 | Saigusa et al. | |
| 7,204,912 B2 | 4/2007 | Saigusa et al. | |
| 7,282,112 B2 | 10/2007 | Nishimoto et al. | |
| 7,291,566 B2 | 11/2007 | Escher et al. | |
| 7,300,537 B2 | 11/2007 | O'Donnell et al. | |
| 7,311,797 B2 | 12/2007 | O'Donnell et al. | |
| 7,364,798 B2 | 4/2008 | Harada et al. | |
| 2001/0003271 A1 | 6/2001 | Otsuki | |
| 2001/0050144 A1 | 12/2001 | Nishikawa et al. | |
| 2002/0018921 A1 | 2/2002 | Yamada et al. | |
| 2002/0066532 A1 | 6/2002 | Shih et al. | |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |

| | | | | | |
|---|---|---|---|---|---|
| 2002/0086545 A1 | 7/2002 | O'Donnell et al. | JP | 05-238855 | 9/1993 |
| 2002/0086553 A1 | 7/2002 | O'Donnell et al. | JP | 06-011346 | 2/1994 |
| 2002/0090464 A1 | 7/2002 | Jiang et al. | JP | 06-196548 | 7/1994 |
| 2002/0142611 A1 | 10/2002 | O'Donnell et al. | JP | 06-256926 | 9/1994 |
| 2002/0177001 A1 | 11/2002 | Harada et al. ............... 428/469 | JP | 06-287739 | 10/1994 |
| 2003/0010446 A1 | 1/2003 | Kajiyama et al. | JP | 07-058013 A | 3/1995 |
| 2003/0029563 A1 | 2/2003 | Kaushal et al. | JP | 09-228070 | 9/1997 |
| 2003/0084848 A1 | 5/2003 | Long | JP | 10-045461 | 2/1998 |
| 2003/0113479 A1 | 6/2003 | Fakuda et al. ............... 427/569 | JP | 10-045467 | 2/1998 |
| 2003/0150419 A1 | 8/2003 | Daragheh et al. | JP | 10-130884 | 5/1998 |
| 2003/0200929 A1 | 10/2003 | Otsuki | JP | 10-226869 | 8/1998 |
| 2004/0026372 A1 | 2/2004 | Takenaka et al. | JP | 10-251871 | 9/1998 |
| 2004/0035364 A1 | 2/2004 | Tomoyoshi et al. | JP | 11-001757 | 1/1999 |
| 2004/0050495 A1 | 3/2004 | Sumiya et al. | JP | 11-080925 | 3/1999 |
| 2004/0060516 A1 | 4/2004 | Nishimoto et al. | JP | 11-207161 | 8/1999 |
| 2004/0060656 A1 | 4/2004 | Saigusa et al. | JP | 11-233292 | 8/1999 |
| 2004/0060657 A1 | 4/2004 | Saigusa et al. | JP | 11-310451 | 11/1999 |
| 2004/0060658 A1 | 4/2004 | Nishimoto et al. | JP | 11-312646 | 11/1999 |
| 2004/0060661 A1 | 4/2004 | Nishimoto et al. | JP | 2000-077395 * | 3/2000 |
| 2004/0060779 A1 | 4/2004 | Kreger | JP | 2000-119840 A | 4/2000 |
| 2004/0061447 A1 | 4/2004 | Saigusa et al. | JP | 2001-031484 | 2/2001 |
| 2004/0063333 A1 | 4/2004 | Saigusa et al. | JP | 2001-152307 | 6/2001 |
| 2004/0072426 A1 | 4/2004 | Jung | JP | 2001-164354 | 6/2001 |
| 2004/0081746 A1 | 4/2004 | Imafuku | JP | 2002-134481 | 5/2002 |
| 2004/0083970 A1 | 5/2004 | Imafuku et al. | KR | 1991-002451 | 6/1988 |
| 2004/0125359 A1 | 7/2004 | Ludviksson et al. | KR | 1999-0008937 | 9/1994 |
| 2004/0168640 A1 | 9/2004 | Muto et al. | KR | 1998-063542 | 10/1998 |
| 2004/0173155 A1 | 9/2004 | Nishimoto et al. | KR | 1999-008142 | 1/1999 |
| 2004/0216667 A1 | 11/2004 | Mitsuhashi | KR | 1999-13565 | 2/1999 |
| 2005/0103268 A1 | 5/2005 | Nishimoto et al. | KR | 10-0266840 | 6/2000 |
| 2005/0103275 A1 | 5/2005 | Sasaki et al. | KR | 10-0275831 | 9/2000 |
| 2005/0150866 A1 | 7/2005 | O'Donnell ............ 216/67 | KR | 2002-0027373 | 4/2002 |
| 2006/0134919 A1 | 6/2006 | Hamelin et al. | KR | 10/2004-0007601 | 1/2004 |
| 2006/0183344 A1 | 8/2006 | Escher et al. | WO | 01/42526 | 6/2001 |
| 2007/0026246 A1 | 2/2007 | Harada et al. | WO | 02/48421 | 6/2002 |
| 2007/0028839 A1 | 2/2007 | Saigusa et al. | WO | 2004/030011 | 4/2004 |
| 2007/0034337 A1 | 2/2007 | Nishimoto et al. | WO | 2004/030012 | 4/2004 |
| 2007/0096658 A1 | 5/2007 | Saigusa et al. | WO | 2004/030013 | 4/2004 |
| 2007/0102287 A1 | 5/2007 | Nishimoto et al. | WO | 2004/030014 | 4/2004 |
| 2007/0107846 A1 | 5/2007 | Saigusa et al. | WO | 2004/030015 | 4/2004 |
| 2007/0125494 A1 | 6/2007 | Saigusa et al. | WO | 2004/030020 | 4/2004 |
| 2007/0142956 A1 | 6/2007 | Escher et al. | WO | 2004/030426 | 4/2004 |
| 2007/0204794 A1 | 9/2007 | Nishimoto et al. | WO | 2004/095530 | 11/2004 |
| 2008/0066647 A1 | 3/2008 | Harada et al. | WO | 2004/095532 | 11/2004 |
| 2008/0069966 A1 | 3/2008 | Otsuki | WO | WO 2004/095530 | 11/2004 |
| 2008/0070028 A1 | 3/2008 | Harada et al. | WO | WO 2004/095532 | 11/2004 |
| 2008/0070032 A1 | 3/2008 | Otsuki | | | |
| 2008/0070051 A1 | 3/2008 | Harada et al. | | | |

FOREIGN PATENT DOCUMENTS

| | | |
|---|---|---|
| EP | 0326318 | 8/1989 |
| EP | 0 508 731 | 10/1992 |
| EP | 0 799 904 | 10/1997 |
| GB | 2 252 567 | 8/1992 |
| JP | 59-186325 | 10/1984 |
| JP | 61-207566 | 9/1986 |
| JP | 62-067161 | 3/1987 |
| JP | 63-000450 | 1/1988 |
| JP | 1-120328 | 8/1989 |
| JP | 02-267967 | 11/1990 |
| JP | 05-070922 | 3/1993 |
| JP | 05-121360 | 5/1993 |

OTHER PUBLICATIONS

Yousha Gitjutsu Handbook, 1st Edition, Japan Thermal Spraying Society, Techno Consultants, Inc., pp. 3, 316-317 (1998) (with partial English translation).

Production drawing for Deposition Shield, Upper believed to be sold in the U.S. on Apr. 12, 2000.

Production drawing for Deposition Shield believed to be sold in the U.S. prior to Sep. 30, 2001.

Production drawing for Upper Electrode believed to be sold in the U.S. prior to Sep. 30, 2001.

JIS Using Series, "Spraying Techniques Manual.", p. 95 (Oct. 30, 1998, Japanese Standard Association), with English Translation.

Kim, Hee Jee, "Plasma-Sprayed Alumina-Yttria Ceramic Coatings for Cavitation-Erosion Protection," Sep. 1989, pp. 139-146.

* cited by examiner

METHOD AND APPARATUS FOR AN IMPROVED OPTICAL WINDOW DEPOSITION SHIELD IN A PLASMA PROCESSING SYSTEM

CROSS-REFERENCE TO RELATED APPLICATIONS

This application is a continuation of and claims the benefit of priority under 35 USC §120 from U.S. Ser. No. 10/803,994, filed Mar. 19, 2004 now U.S. Pat. No. 7,163,585, which is a divisional of and claims priority from U.S. Ser. No. 10/259,352, filed Sep. 30, 2002 now U.S. Pat. No. 6,798,519, issued on Sep. 28, 2004, the entire contents of each which are incorporated herein by reference. This application is also related to U.S. Pat. No. 7,147,749, entitled "Method and apparatus for an improved upper electrode plate with deposition shield in a plasma processing system", issued on Dec. 12, 2006; U.S. Pat. No. 6,837,966, entitled "Method and apparatus for an improved baffle plate in a plasma processing system", issued on Jan. 4, 2005; co-pending U.S. patent application Ser. No. 10/259,380, entitled "Method and apparatus for an improved baffle plate in a plasma processing system", filed on Sep. 30, 2002; U.S. Pat. No. 7,137,353, entitled "Method and apparatus for an improved deposition shield in a plasma processing system", issued on Nov. 21, 2006; co-pending U.S. patent application Ser. No. 10/259,757, entitled "Method and apparatus for an improved upper electrode plate in a plasma processing system", filed on Sep. 30, 2002; and co-pending U.S. patent application Ser. No. 10/259,306, entitled "Method and apparatus for an improved bellows shield in a plasma processing system", filed on Sep. 30, 2002. The entire contents of all of those applications are herein incorporated by reference in their entirety.

FIELD OF THE INVENTION

The present invention relates to an improved component for a plasma processing system and, more particularly, to an optical window deposition shield employed in a plasma processing system to provide optical access to a process space through a deposition shield.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved optical window deposition shield for optical access to a process space in a plasma processing system through a deposition shield, wherein the design and fabrication of the optical window deposition shield advantageously addresses the above-identified shortcomings.

It is an object of the present invention to provide an optical window deposition shield comprising a plug configured to extend through an opening formed in the deposition shield, a flange coupled to the plug and configured to attach the optical window deposition shield to the deposition shield. The plug comprises a frontal surface and a perimeter surface coupled thereto. The flange comprises a first surface, a second surface, and an edge surface, wherein the first surface further comprises a mating surface.

It is another object of the present invention that the optical window deposition shield comprises at least one optical through-hole coupled to the frontal surface of the plug and the second surface of the flange and configured to permit the passage of light, wherein such an optical through-hole can comprise an exposed entrant surface coupled to the frontal surface of the plug, and an interior through-hole surface coupled to the exposed entrant surface and to the second surface of the flange.

It is another object of the present invention that the optical window deposition shield comprises a plurality of fastening receptors coupled to the mating surface of the first surface of the flange and the second surface of the flange and configured to receive fastening devices, wherein each fastening receptor can comprise an entrant region, a through-hole region, an exit through-hole, an interior fastener surface, and a recessed fastener surface.

It is another object of the present invention that the optical window deposition shield further comprises a protective barrier formed on a plurality of exposed surfaces of the optical window deposition shield exposed to the processing plasma.

It is a further object of the present invention that the exposed surfaces of the deposition shield comprise the frontal surface of the plug, the perimeter surface of the plug, the first surface of the flange excluding the mating surface, and the exposed entrant surface of the at least one optical through-hole.

The present invention further provides a method of producing the optical window deposition shield in the plasma processing system comprising the steps: fabricating the optical window deposition shield; anodizing the optical window deposition shield to form a surface anodization layer on the optical window deposition shield; machining the exposed surfaces on the optical window deposition shield to remove the surface anodization layer; and forming a protective barrier on the exposed surfaces.

The present invention provides another method of producing the optical window deposition shield in the plasma processing system comprising the steps: fabricating the optical window deposition shield; masking the exposed surfaces on the optical window deposition shield to prevent formation of a surface anodization layer; anodizing the optical window deposition shield to form the surface anodization layer on the optical window deposition shield; unmasking the exposed surfaces; and forming a protective barrier on the exposed surfaces.

The present invention provides another method of producing the optical window deposition shield in the plasma processing system comprising the steps: fabricating the optical window deposition shield; and forming a protective barrier on exposed surfaces.

The present invention also includes another method that combines masking portions of the exposed surfaces before anodization and leaving other portions of the exposed surfaces unmasked; anodizing the unmasked surfaces; machining the portions of the exposed surfaces that were unmasked and which were anodized; unmasking the masked portions of the exposed surfaces; and forming a protective barrier on the exposed surfaces.

Any of the above methods may also optionally include machining anodized (or otherwise coated) surfaces that are not exposed surfaces (e.g., to obtain a bare metal connection where the machined surface will mate with another part).

It is another object of the present invention that the optical window deposition shield serves as an insert, wherein the insert comprises no optical through-holes and can be produced using any of the above methods.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention provides an improved optical window deposition shield for a plasma processing system to provide optical access to a process space through a deposition shield, wherein the design and fabrication of the optical window deposition shield advantageously addresses known shortcomings.

Figure 1:
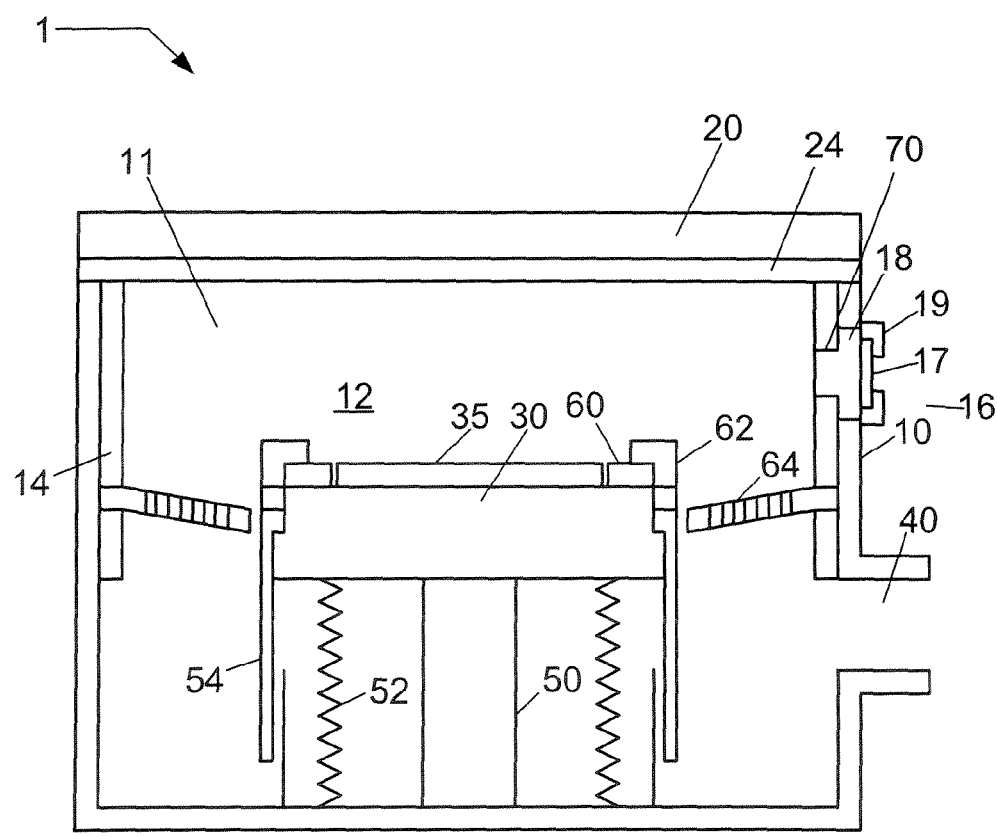
FIG. 1 shows a simplified block diagram of a plasma processing system comprising an optical window deposition shield according to an embodiment of the present invention.

According to an embodiment of the present invention, a plasma processing system 1 is depicted in FIG. 1 comprising a plasma processing chamber 10, an upper assembly 20, an electrode plate 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in a process space 12 adjacent substrate 35. The plasma processing system 1 can be configured to process any substrate (e.g., 200 mm substrates, 300 mm substrates, or larger).

In the illustrated embodiment, upper assembly 20 can comprise at least one of a cover, a gas injection assembly, and an upper electrode impedance match network. For example, the electrode plate 24 can be coupled to an RF source. In another alternate embodiment, the upper assembly 20 comprises a cover and an electrode plate 24, wherein the electrode plate 24 is maintained at an electrical potential equivalent to that of the plasma processing chamber 10. For example, the plasma processing chamber 10, the upper assembly 20, and the electrode plate 24 can be electrically connected to ground potential.

Plasma processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermoelectric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2A:
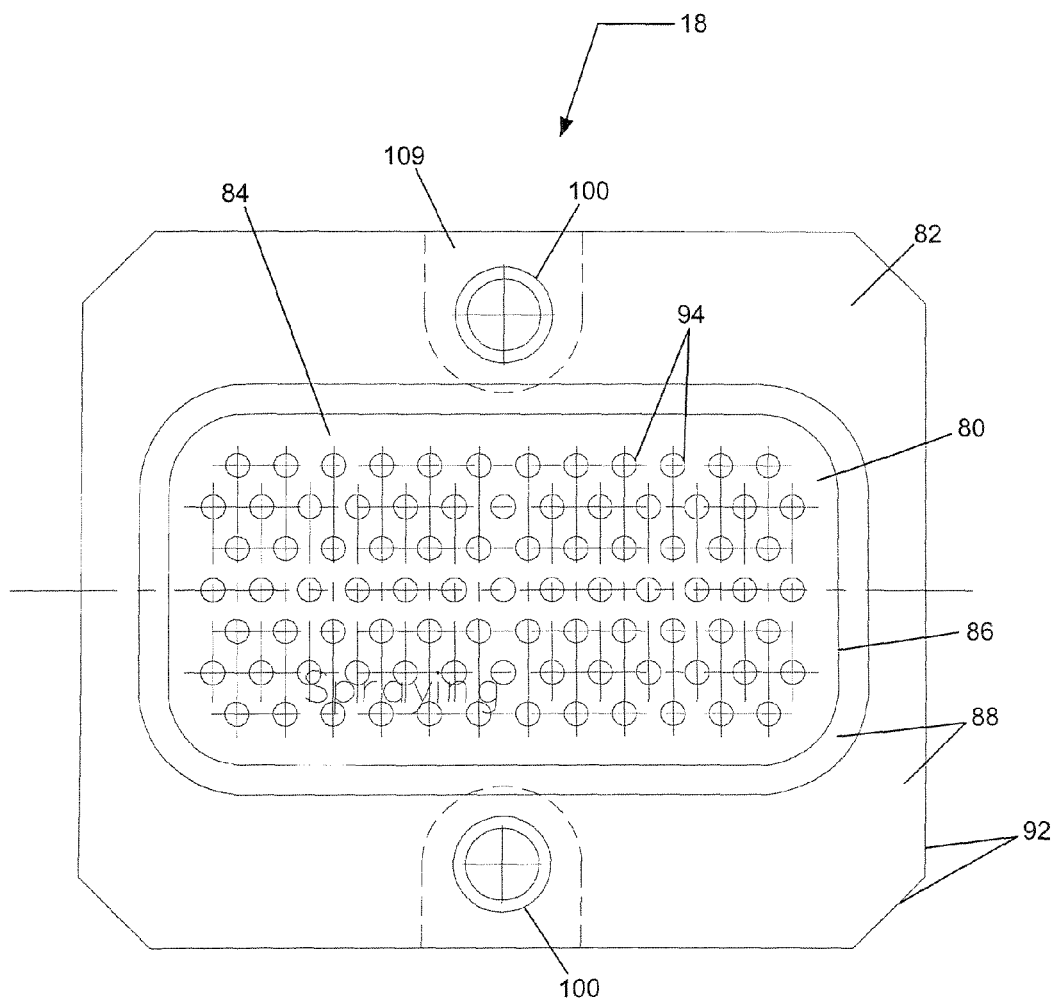
FIG. 2A shows a plan view of an optical window deposition shield for a plasma processing system according to an embodiment of the present invention.
Figure 3A:
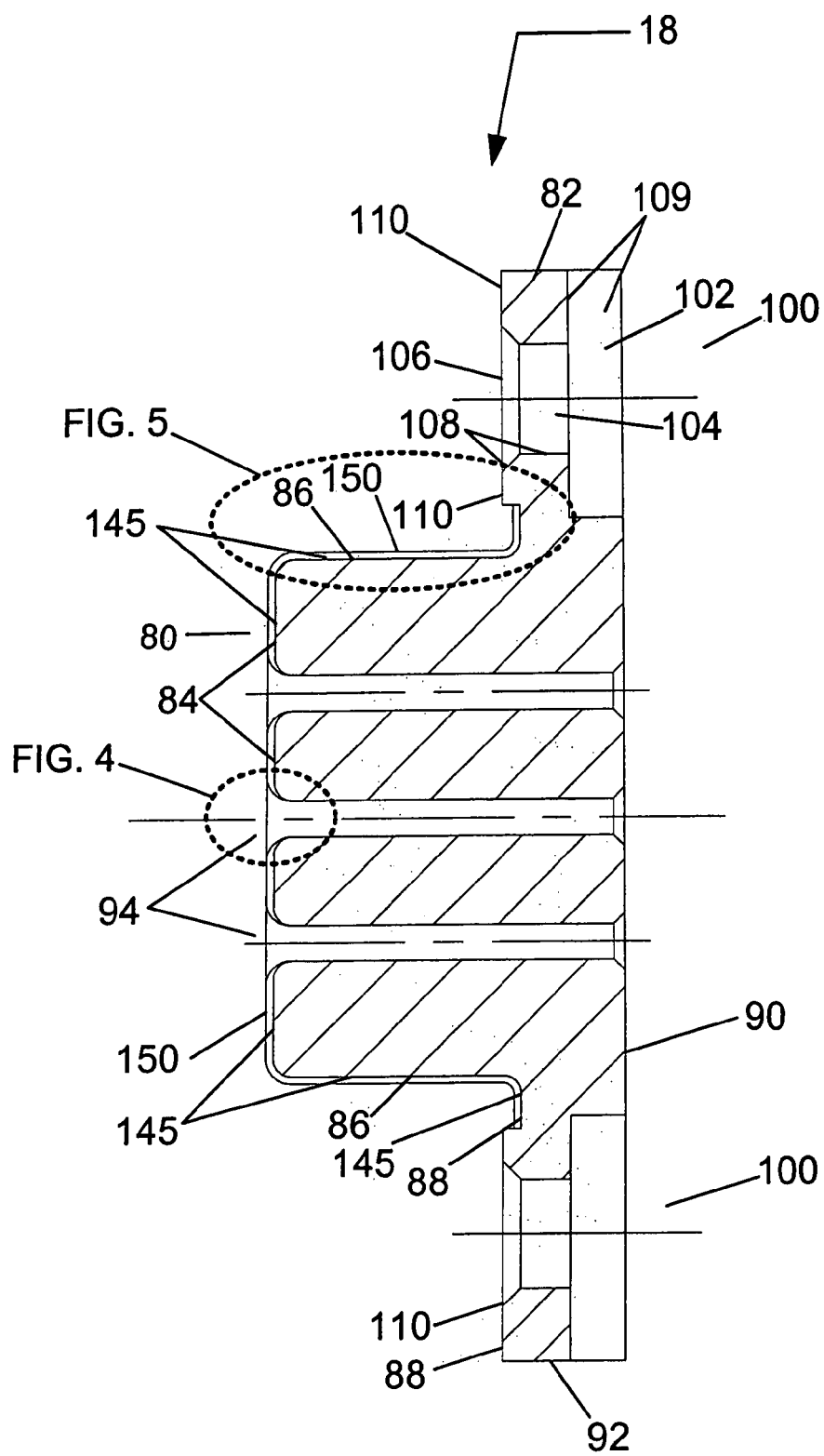
FIG. 3A shows a cross sectional view of an optical window deposition shield for a plasma processing system according to an embodiment of the present invention.
Figure 3B:
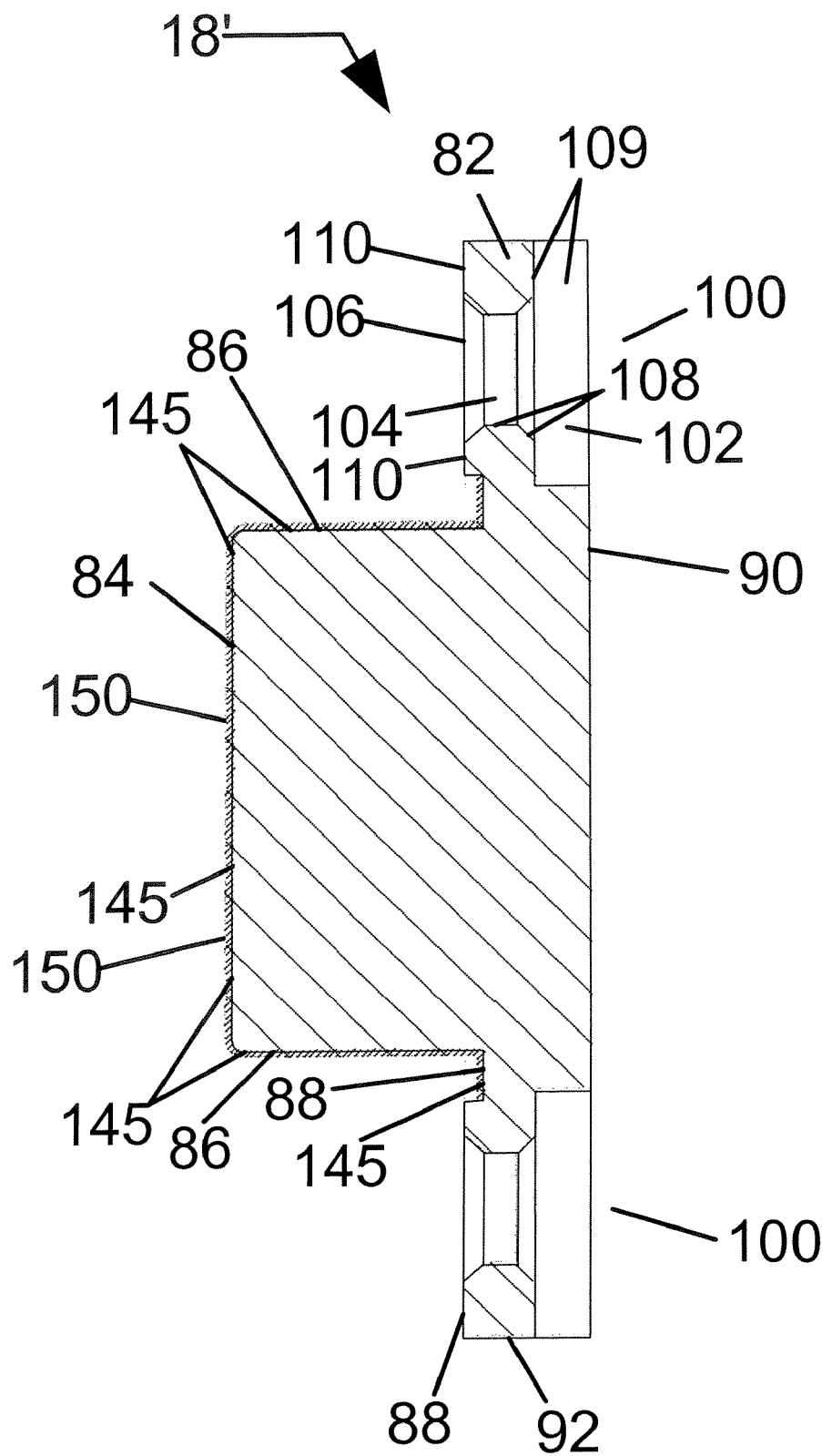
FIG. 3B shows a cross sectional view of an insert for a plasma processing system according to an embodiment of the present invention.

Referring now to an illustrated embodiment of the present invention depicted in FIGS. 2A (plan view) and 3A (cross sectional view), optical window deposition shield 18 comprises a plug 80 configured to extend through an opening in the deposition shield 14, and a flange 82 coupled to the plug 80 and configured to attach the optical window deposition shield 18 to the deposition shield 14. As shown in FIG. 3A, the plug 80 comprises a frontal surface 84 configured to face a processing plasma in the process space 12, and a perimeter surface 86 configured to mate with a first opening surface in the opening 70 (FIG. 1) of the deposition shield 14. Additionally, the flange 82 comprises a first surface 88 coupled to the perimeter surface 86 of plug 80, a second surface 90, and an edge surface 92. Furthermore, for example, a width (along a major axis) of the plug 80 can range from 1 to 100 mm. Desirably, the width can range from 10 to 40 mm, and, preferably, the width is at least 25 mm. Furthermore, for example, a height (along a minor axis) of the plug 80 can range from 1 to 100 mm. Desirably, the height can range from 10 to 40 mm, and, preferably, the height is at least 15 mm.

With continuing reference to FIGS. 2A and 3A, the optical window deposition shield 18 can, for example, further include at least one optical through-hole 94 coupled to the frontal surface 84 of the plug 80 and to the second surface 90 of the flange 82, and configured to permit the passage of light to and/or from the process space 12.

Figure 4:
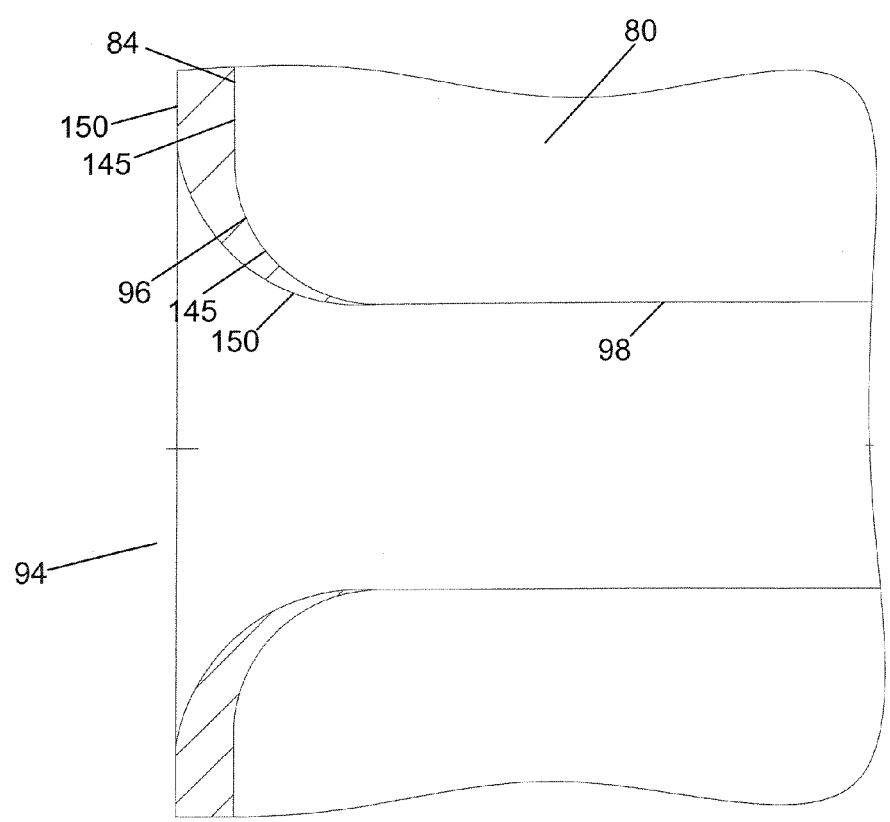
FIG. 4 shows an expanded cross sectional view of an optical through-hole for an optical window deposition shield in a plasma processing system according to an embodiment of the present invention.

FIG. 4 presents an expanded view of optical through-hole 94, wherein optical through-hole 94 comprises an exposed entrant surface 96 coupled to the frontal surface 84 of the plug 80, and an interior through-hole surface 98 coupled to the exposed entrant surface 96 and the second surface 90 of the flange 82. Furthermore, for example, a diameter of at least one optical through-hole 94 can range from 0.5 to 20 mm. Desirably, the diameter can range from 0.5 to 5 mm, and, preferably, the width is at least 0.5 mm. Furthermore, for example, the number of optical through-holes 94 can range from 1 to 500. Desirably, the number can range from 1 to 100, and, preferably, the number is at least 1.

Figure 2B:
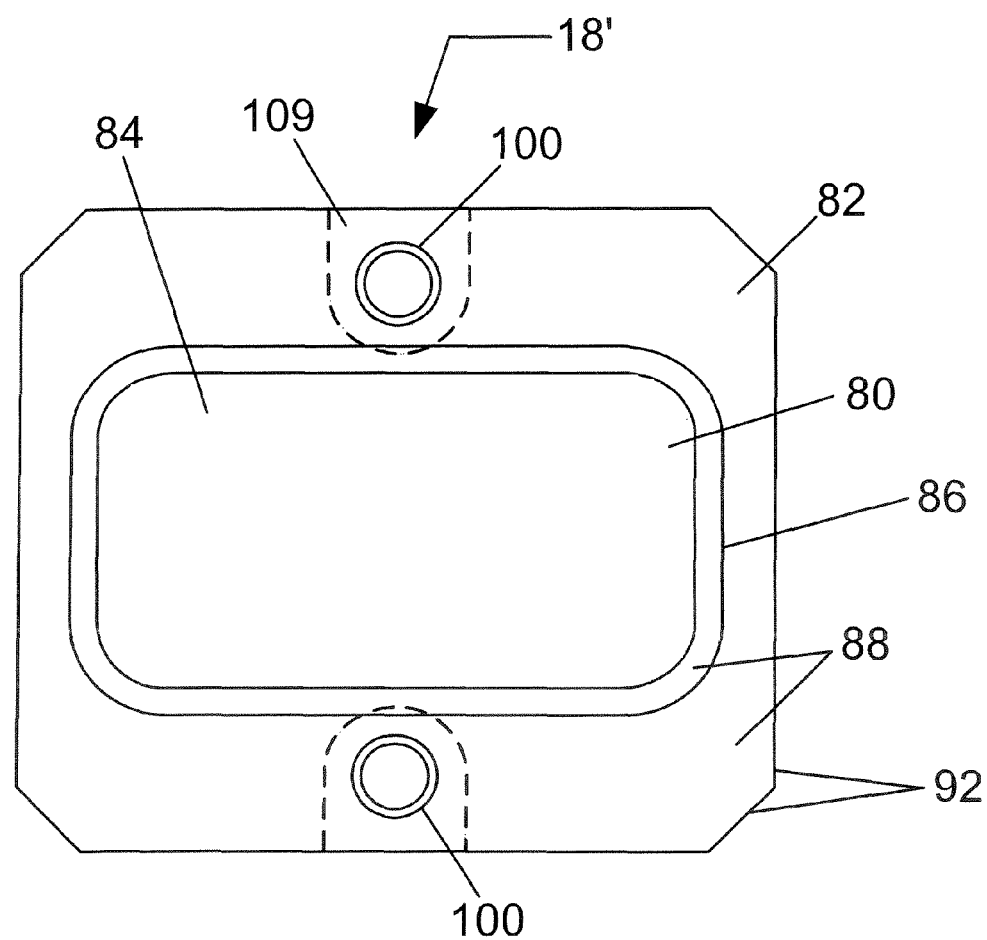
FIG. 2B shows a plan view of an insert for a plasma processing system according to an embodiment of the present invention.

In an alternate embodiment, the optical window deposition shield 18 comprises no optical through-holes. In the illustrated embodiment as shown in FIGS. 2B (plan view) and 3B (cross-sectional view), the optical window deposition shield 18 serves as an insert 18' to fill the opening in the deposition shield 14 (i.e. optical access is not required for the specific process).

Referring to FIGS. 2A,B and 3A,B, flange 82 can, for example, further comprise a plurality of fastening receptors 100, each fastening receptor 100 coupled to the first surface 88 and the second surface 90 of the flange 82, and configured to receive fastening devices (not shown) (such as bolts) to couple optical window deposition shield 18 to deposition shield 14. The fastening receptors 100 can comprise an entrant region 102, a through-hole region 104, an exit through-hole 106, an interior fastener surface 108, and a recessed fastener surface 109. Furthermore, a portion of the first surface 88 of flange 82 can comprise a mating surface 110 configured to couple to a mating surface of the deposition shield 14 (FIG. 1). For example, the number of fastening receptors 100 formed within optical window deposition shield 18 can range from 0 to 100. Desirably, the number of fastening receptors 100 can range from 1 to 8; and, preferably, the number of fastening receptors 100 is at least 2 fastening receptors. For further details regarding the coupling of the optical window deposition shield 18 to the deposition shield 14, co-pending U.S. Pat. No. 7,137,353, entitled "Method and apparatus for an improved deposition shield in a plasma processing system", issued on Nov. 21, 2006, is incorporated herein by reference in its entirety.

Figure 5:
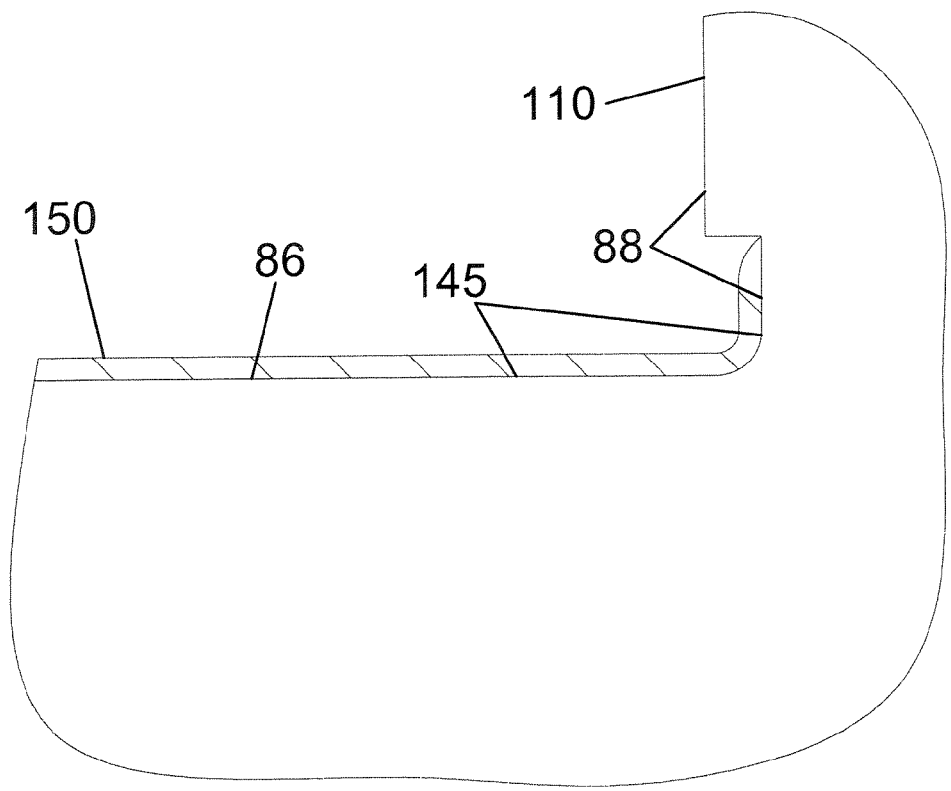
FIG. 5 shows an expanded view of a perimeter surface of a plug and a first surface of a flange for an optical window deposition shield in a plasma processing system according to an embodiment of the present invention.

FIG. 5 provides an expanded view of the perimeter surface 86 of the plug 80, and the first surface 88 of the flange 82, and the coupling therebetween.

Referring now to FIGS. 2 through 5, the optical window deposition shield 18 further comprises a protective barrier 150 formed on a plurality of exposed surfaces 145 of the optical window deposition shield 18. In an embodiment of the present invention, the exposed surfaces 145 can comprise the frontal surface 84 of the plug 80, the perimeter surface 86 of the plug 80, and the first surface 88 of the flange 82 excluding the mating surface 110. Additionally, the exposed surfaces 145 can comprise the exposed entrant surface 96 of the at least one optical through-hole 94. In an alternate embodiment, the exposed surfaces 145 can include mating surface 110.

In an embodiment of the present invention, the protective barrier 150 can comprise a compound including an oxide of aluminum such as $Al_2O_3$. In another embodiment of the present invention, the protective barrier 150 can comprise a mixture of $Al_2O_3$ and $Y_2O_3$. In another embodiment of the present invention, the protective barrier 150 can comprise at least one of a III-column element (column III of periodic table) and a Lanthanon element. In another embodiment of the present invention, the III-column element can comprise at least one of Yttrium, Scandium, and Lanthanum. In another embodiment of the present invention, the Lanthanon element can comprise at least one of Cerium, Dysprosium, and Europium. In another embodiment of the present invention, the compound forming protective barrier 150 can comprise at least one of Yttria ($Y_2O_3$), $Sc_2O_3$, $Sc_2F_3$, $YF_3$, $La_2O_3$, $CeO_2$, $Eu_2O_3$, and $Dy_2O_3$.

In an embodiment of the present invention, the protective barrier 150 formed on optical window deposition shield 18 can comprise a minimum thickness, wherein the minimum thickness can be specified as constant across at least one of the exposed surfaces 145. In another embodiment, the minimum thickness can be variable across the exposed surfaces 145. Alternately, the minimum thickness can be constant over a first portion of an exposed surface and variable over a second portion of an exposed surface. For example, a variable thickness can occur on a curved surface, on a corner, or in a hole. For example, the minimum thickness can range from 0.5 micron to 500 micron. Desirably, the minimum thickness can range from 5 micron to 200 micron, and, preferably, the minimum thickness is at least 5 micron.

Figure 6:
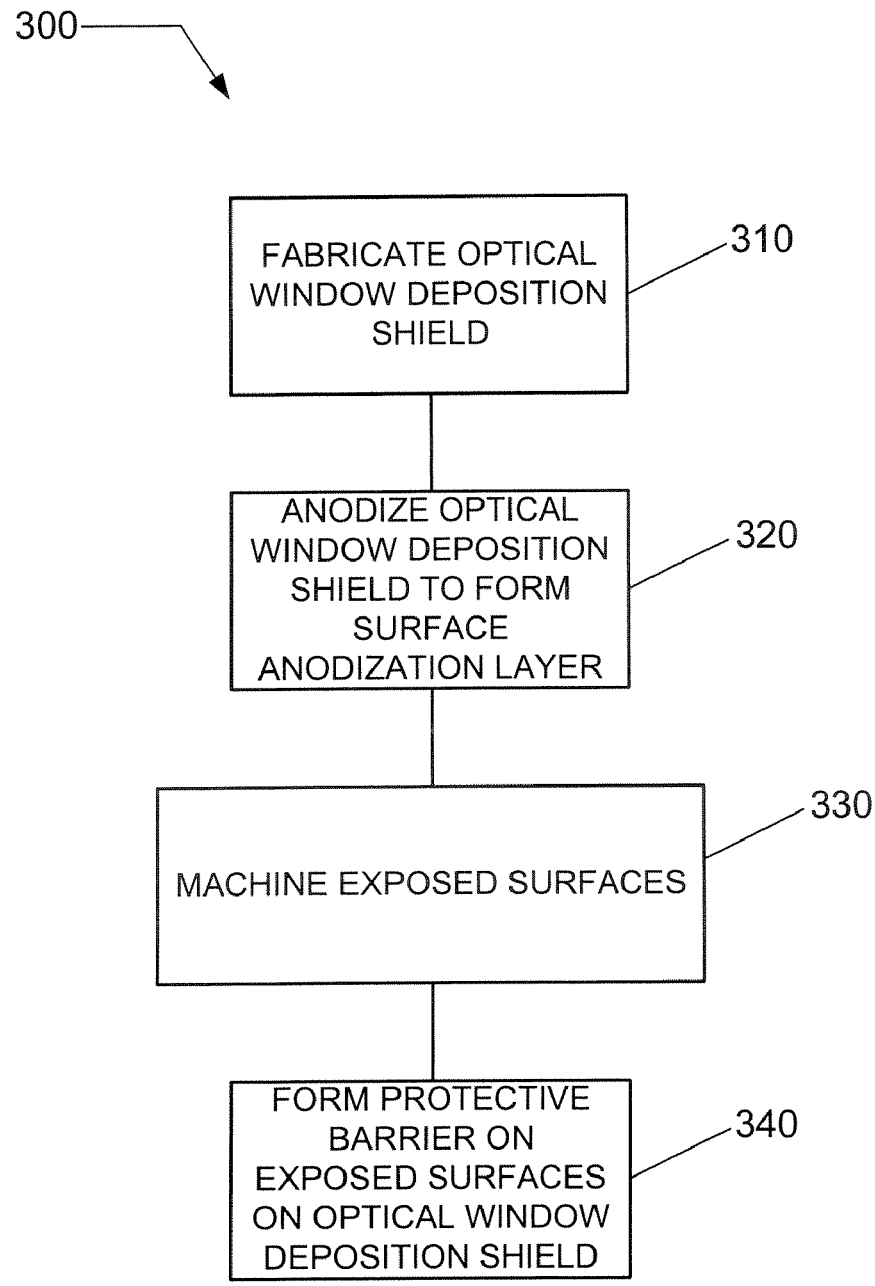
FIG. 6 presents a method of producing an optical window deposition shield for a plasma processing system according to an embodiment of the present invention.

FIG. 6 presents a method of producing the optical window deposition shield 18 for the plasma processing system 1 described in FIG. 1 according to an embodiment of the present invention. A flow diagram 300 begins in 310 with fabricating the optical window deposition shield 18 (as described above). Fabricating the optical window deposition shield comprises at least one of machining, casting, polishing, forging, and grinding. For example, elements of the optical window deposition shield 18 can be machined according to specifications set forth on a mechanical drawing, using conventional techniques including a mill, a lathe, etc. The techniques for machining a component using, for example, a mill or a lathe, are well known to those skilled in the art of machining. The optical window deposition shield 18 can, for example, be fabricated from aluminum.

In 320, the optical window deposition shield 18 is anodized to form a surface anodization layer. For example, when fabricating the optical window deposition shield 18 from aluminum, the surface anodization layer comprises aluminum oxide ($Al_2O_3$). Methods of anodizing aluminum components are well known to those skilled in the art of surface anodization.

In 330, exposed surfaces 145 on the anodized optical window deposition shield 18 are identified, and the surface anodization layer is removed from the exposed surfaces 145 using standard machining techniques. In an embodiment of the present invention, the exposed surfaces comprise the frontal surface of the plug, the perimeter surface of the plug, the first surface of the flange excluding the mating surface, and the exposed entrant surface of the at least one optical through-hole.

In 340, the protective barrier 150 (as described above) is formed on the exposed surfaces 145 identified in 330. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

Figure 7:
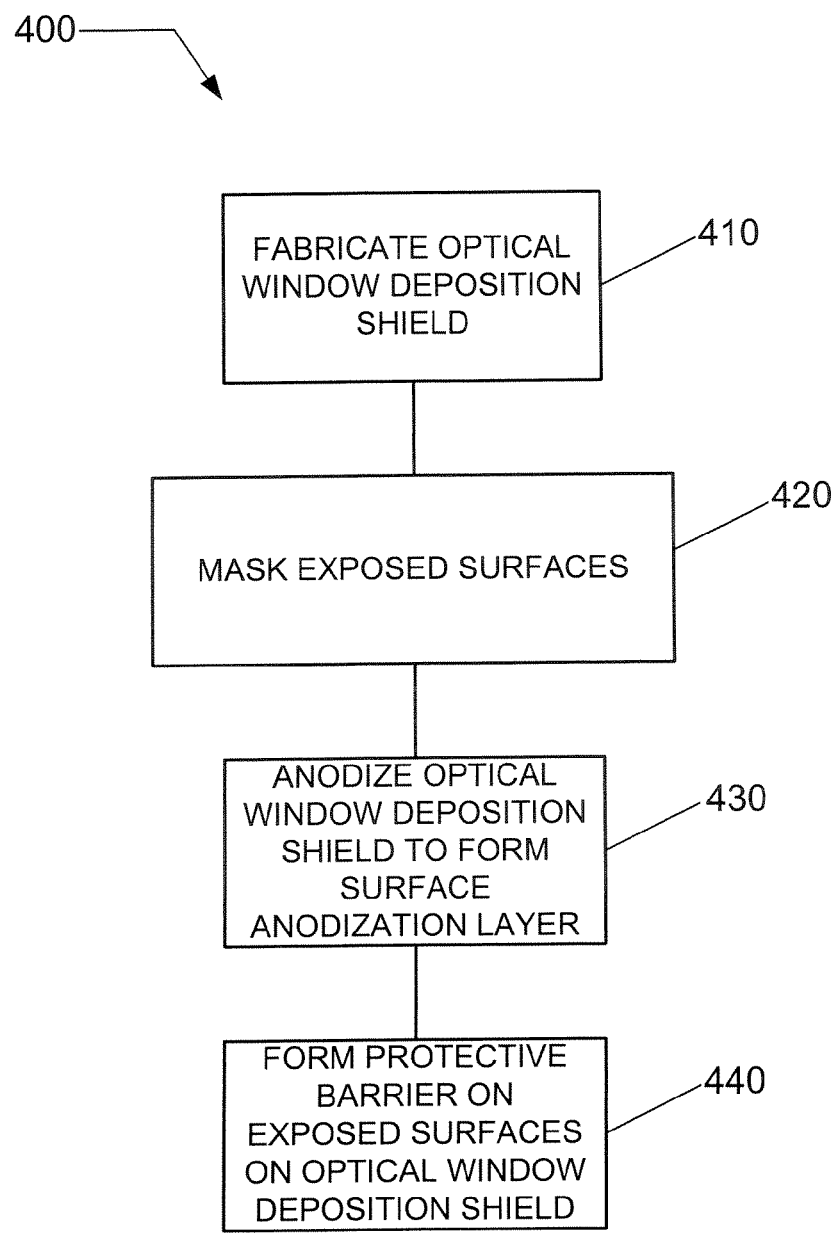
FIG. 7 presents a method of producing an optical window deposition shield for a plasma processing system according to another embodiment of the present invention.

FIG. 7 presents a method of producing the optical window deposition shield 18 in the plasma processing system 1 described in FIG. 1 according to another embodiment of the present invention. A flow diagram 400 begins in 410 with fabricating the optical window deposition shield 18 (as described above). Fabricating the optical window deposition shield 18 comprises at least one of machining, casting, polishing, forging, and grinding. For example, elements of the shield 18 can be machined according to specifications set forth on a mechanical drawing, using conventional techniques including a mill, a lathe, etc. The techniques for machining a component using, for example, a mill or a lathe, are well known to those skilled in the art of machining. The optical window deposition shield 18 can, for example, be fabricated from aluminum.

In 420, exposed surfaces 145 of the optical window deposition shield 18 are masked to prevent the formation of a surface anodization layer thereon. In an embodiment of the present invention, the exposed surfaces 145 comprise the frontal surface of the plug, the perimeter surface of the plug, the first surface of the flange excluding the mating surface, and the exposed entrant surface of the at least one optical through-hole. Techniques for surface masking and unmasking are well known to those skilled in the art of surface coatings and surface anodization.

In 430, the optical window deposition shield 18 is anodized to form a surface anodization layer on the remaining unmasked surfaces. For example, when fabricating the optical window deposition shield 18 from aluminum, the surface anodization layer can comprise aluminum oxide ($Al_2O_3$). Methods of anodizing aluminum components are well known to those skilled in the art of surface anodization.

In 440, the exposed surfaces 145 are unmasked, and a protective barrier 150 (as described above) is formed on the exposed surfaces 145. A protective barrier comprising, for example Yttria, can be formed using (thermal) spray coating techniques that are well known to those skilled in the art of ceramic spray coatings. In an alternate embodiment, forming the protective barrier 150 can further comprise polishing (or smoothing) the thermal spray coating. For example, polishing the thermal spray coating can comprise the application of sand paper to the sprayed surfaces.

Figure 8:
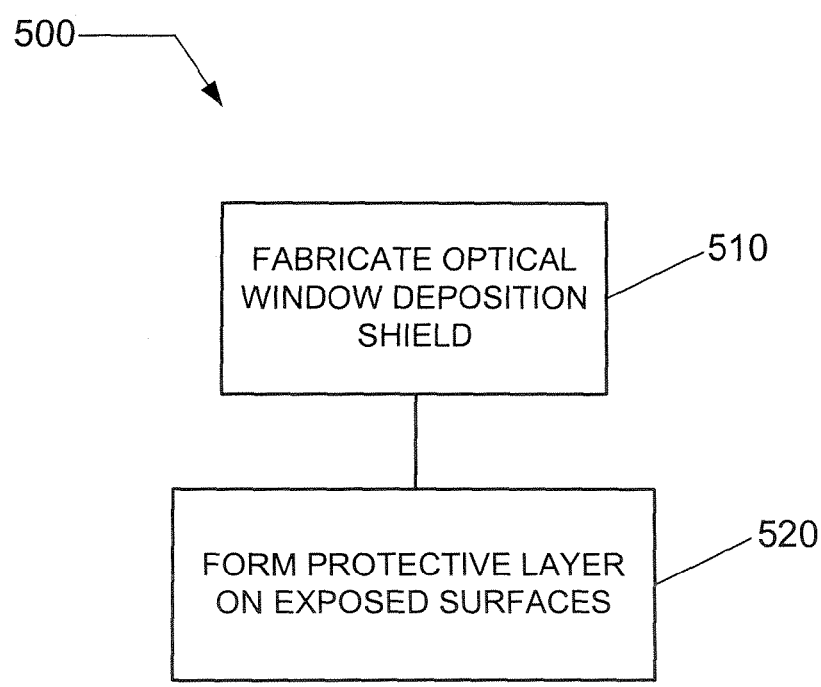
FIG. 8 presents a method of producing an optical window deposition shield for a plasma processing system according to another embodiment of the present invention.

FIG. 8 presents a method of producing the optical window deposition shield 18 in the plasma processing system 1 described in FIG. 1 according to another embodiment of the present invention. A flow diagram 500 begins in 510 with fabricating the optical window deposition shield 18 (as described above). Fabricating the optical window deposition shield can comprise at least one of machining, casting, polishing, forging, and grinding For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The optical window deposition shield 18 can, for example, be fabricated from aluminum.

In 520, a protective barrier 150 (as described above) is formed on exposed surfaces 145 of the optical window deposition shield 18. In an embodiment of the present invention, the exposed surfaces comprise the frontal surface of the plug, the perimeter surface of the plug, the first surface of the flange excluding the mating surface, and the exposed entrant surface of the at least one optical through-hole. In another embodiment of the present invention, the exposed surfaces comprise all surfaces on the optical window deposition shield 18. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

The present invention also includes another method that combines masking portions of the exposed surfaces before anodization and leaving other portions of the exposed surfaces unmasked; anodizing the unmasked surfaces; machining the portions of the exposed surfaces that were unmasked and which were anodized; unmasking the masked portions of the exposed surfaces; and forming a protective barrier on the exposed surfaces.

Any of the above methods may also optionally include machining anodized (or otherwise coated) surfaces that are not exposed surfaces (e.g., to obtain a bare metal connection where the machined surface will mate with another part).

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An insert for a deposition shield in a plasma processing system comprising:
a plug configured to fit into an opening in said deposition shield, said plug comprising a frontal surface and a perimeter surface;
a flange coupled to said plug and configured to couple said insert to at least one of the deposition shield and a chamber wall of the plasma processing system, said flange comprising:
a first surface extending outward from the perimeter surface to an edge surface, and
a second surface opposing the first surface, the edge surface joining the first and second surfaces, and
a recess positioned between said edge surface and said perimeter surface of said plug, said recess having a recess surface recessed from said first surface; and
a protective barrier provided on at least a portion of said frontal surface and said perimeter surface of said plug, and provided on only a portion of said first surface of the flange.

2. The insert as recited in claim 1, further comprising a plurality of fastening receptors coupled to said first surface of said flange and said second surface of said flange and configured to receive fastening devices in order to couple said insert to the at least one of the deposition shield and the chamber wall.

3. The insert as recited in claim 2, wherein each of said plurality of fastening receptors comprises an entrant region, an entrant cavity, an exit through-hole, an interior fastener surface, and a recessed fastener surface.

4. The insert as recited in claim 1, wherein said protective barrier is also provided on at least a portion of said recess surface.

5. The insert as recited in claim 1, wherein said protective barrier comprises a compound containing at least one of a group III element and a Lanthanon element.

6. The insert as recited in claim 1, wherein said group III element comprises at least one of Yttrium, Scandium, and Lanthanum.

7. The insert as recited in claim 5, wherein said Lanthanon element comprises at least one of Cerium, Dysprosium, and Europium.

8. The insert as recited in claim 1, wherein said protective barrier comprises at least one of Yttria ($Y_2O_3$), $Sc_2O_3$, $Sc_2F_3$, $YF_3$, $La_2O_3$, $CeO_2$, $Eu_2O_3$, and $DyO_3$.

9. The insert as recited in claim 1, wherein said plurality of exposed surfaces, having said protective barrier thereon, further comprise said interior fastener surface.

10. The insert of claim 1, wherein said protective barrier is provided on at least a portion of said recess.

11. The insert of claim 10, wherein said protective barrier is provided on only a portion of said recess.

12. The insert as recited in claim 1, wherein said recess comprises:
a first sidewall extending from said first surface to said recess surface, said first sidewall being substantially at right angles to said first surface and said recess surface; and
a second sidewall opposing said first sidewall and extending from said recess surface to said perimeter surface of said plug, said second sidewall being substantially at a right angle to said recess surface, wherein said second sidewall and said recess have said protective barrier provided thereon.

13. The insert as recited in claim 1, wherein said protective barrier includes a coating which comprises yttrium.

14. The insert as recited in claim 13, wherein said first sidewall does not include said protective barrier thereon.

15. The insert as recited in claim 1, wherein:
said first surface comprises a bare metal surface not having said protective barrier thereon and not having an anodized layer thereon; and
said insert further comprises at least one surface having an anodized layer thereon.

16. The insert as recited in claim 1, wherein said protective barrier is provided in direct contact with a bare surface of said insert not having an anodization layer thereon.

17. The insert as recited in claim 1, wherein said plug further comprises a plurality of optical through holes, each optical through hole comprising:
an interior through hole surface; and
an exposed entrant surface extending from said frontal surface to said interior through hole surface, wherein said exposed entrant surface includes said protective barrier provided thereon.

18. The insert as recited in claim 17, wherein:
said exposed entrant surface comprises a rounded edge;
said protective barrier is a coating which comprises Yttria; and
said interior through hole surface does not include said protective barrier thereon.

19. The insert as recited in claim 18, wherein said protective barrier has a first thickness on said frontal surface and a progressively narrower thickness along the exposed entrant surface, and terminates on said interior through hole surface.

20. The insert as claimed in claim 1, wherein said protective barrier is a coating which comprises yttrium.

21. The insert as claimed in claim 20, wherein said protective barrier is a coating which comprises $YF_3$.

22. The insert as claimed in claim 1, wherein said protective barrier is a coating which comprises dysprosium.

23. The insert as claimed in claim 1, wherein said protective barrier is a coating which comprises $Dy_2O_3$.

24. The insert as claimed in claim 1, wherein said protective barrier is a coating which comprises an oxide of dysprosium.

* * * * *